United States Patent
Spencer et al.

(10) Patent No.: US 6,941,506 B2
(45) Date of Patent: Sep. 6, 2005

(54) SWITCHING CIRCUIT FOR DECODER

(75) Inventors: Anthony Spencer, Gloucestershire (GB); Nicholas Weiner, Bristol (GB)

(73) Assignee: Phyworks, Limited, Bristol (GB)

( * ) Notice: Subject to any disclaimer, the term of this patent is extended or adjusted under 35 U.S.C. 154(b) by 350 days.

(21) Appl. No.: 10/160,854

(22) Filed: Jun. 3, 2002

(65) Prior Publication Data

US 2004/0088644 A1 May 6, 2004

(30) Foreign Application Priority Data

May 17, 2002 (GB) .............................................. 0211415

(51) Int. Cl.⁷ .............................................. G06F 11/08
(52) U.S. Cl. ...................................... 714/797; 714/760
(58) Field of Search ................................ 714/797, 760, 714/746, 752, 793, 753; 370/390, 422; 375/341; 711/159; 379/269

(56) References Cited

U.S. PATENT DOCUMENTS

| | | | | |
|---|---|---|---|---|
| 3,656,107 A | * | 4/1972 | Hsiao et al. | 714/753 |
| 4,022,982 A | * | 5/1977 | Hemdal | 370/388 |
| 4,500,994 A | | 2/1985 | McClallister et al. | |
| 5,303,232 A | * | 4/1994 | Proctor et al. | 370/398 |
| 5,367,520 A | * | 11/1994 | Cordell | 370/395.71 |
| 5,463,486 A | * | 10/1995 | Stevens | 398/45 |
| 5,542,048 A | * | 7/1996 | Olnowich et al. | 709/243 |
| 5,774,481 A | | 6/1998 | Meaney et al. | |
| 5,991,857 A | * | 11/1999 | Koetje et al. | 711/157 |
| 6,728,258 B1 | * | 4/2004 | Okada et al. | 370/463 |
| 6,731,700 B1 | * | 5/2004 | Yakhnich et al. | 375/341 |
| 6,781,986 B1 | * | 8/2004 | Sabaa et al. | 370/389 |

FOREIGN PATENT DOCUMENTS

| | | |
|---|---|---|
| EP | 0 439649 A1 | 8/1991 |
| EP | 1 152 542 A1 | 11/2001 |
| EP | 1 221 793 A2 | 7/2002 |
| WO | WO 00/41342 A1 | 7/2000 |

* cited by examiner

*Primary Examiner*—Guy J. Lamarre
*Assistant Examiner*—Mujtaba Chaudry
(74) *Attorney, Agent, or Firm*—Lahive & Cockfield, LLP

(57) ABSTRACT

A switching circuit, for use in soft-decision Extended Hamming Code decoding, allows the detection of pairs of received bits having "low confidence" and whose position-ids SUM to the syndrome of the received code signal, when the occurrence of an even (and non-zero) number of errors is detected.

15 Claims, 2 Drawing Sheets

SWITCHING CIRCUIT FOR DECODER

RELATED APPLICATION

The present application claims priority to a British patent application, Application No. GB 0211415.5 filed on May 17, 2002.

FIELD OF THE INVENTION

This invention relates to an error correcting decoder, and in particular to a switch circuit for use in a decoder.

BACKGROUND OF THE INVENTION

FIG. 1 is a block schematic diagram of a conventional data transmission system, using forward error correction (FEC).

In a communications channel using a systematic forward error correction coding scheme, the data to be communicated, the source data, is encoded using a forward error correction encoder. The encoder 10 computes parity bits, which are transmitted together with the source data. The consequence of combining the parity bits with the source data bits is that only a small fraction of all possible binary sequences (of the combined length) are used for transmission. The binary sequences that are used are referred to as the "codewords".

One family of codes is Extended Hamming codes. In general terms, an Extended Hamming code can be summarised as a set of $2^n-n-1$ data bits (for some integer n) together with an n-bit parity code and a parity check bit.

In the encoder, there is assigned a unique n-bit code, the "position-id", to each bit position in a sequence of up to $2^n$ bit positions (where n is a positive integer). Having received the set of $2^n-n-1$ data bits, the FEC encoder then forms an n-bit "parity code" by the process of SUMMING the n-bit position-ids for all bit positions for which the source data bit is a logic 1. In this respect, and throughout this document, the term SUM, and the "+" symbol, when used in reference to combining two multi-bit binary codes, means bit-wise EXOR of the constituent bits.

Also, the value of the 1-bit "parity check" is determined by whether there is an odd, or even, number of logic 1's in the source data sequence. Typically, although not necessarily, the parity check bit is 1 if there is an odd number of 1's, and otherwise is 0.

The source data and parity bits are transmitted by the transmitter 12 over the communications medium 14. The waveform which subsequently arrives at the receiver 16 is the transmitted waveform, but with distortions and attenuation caused by the medium, and with the addition of noise.

For each received bit, the quantizer 16 determines whether the transmitted binary value is more likely to have been a "1" or a "0".

The FEC decoder 18 performs Forward Error Correction decoding. This process may be summarised as i) identifying whether a received binary sequence is a codeword; and ii) for cases where the received binary sequence is not a codeword, because the distortions and noise introduced by the communications medium have caused one or more errors in the received binary sequence as compared with the transmitted codeword, finding the codeword which is most likely to have been transmitted.

The receiver 16 may use only hard decision (binary) quantization. That is, for each bit in the received waveform, the quantizer outputs one bit. Specifically, for each received bit, the quantizer determines whether the transmitted binary value is more likely to have been a "1" or a "0", and outputs a bit having the corresponding value.

Alternatively, the receiver may use soft decision quantization, namely quantization into more than two levels.

SUMMARY OF THE INVENTION

According to the present invention, there is provided a switching circuit, comprising a plurality of stages, each stage having a plurality of data inputs, a plurality of data outputs corresponding to respective data inputs, and a control input, each stage comprising a switch for directing input signals on all of the data inputs either to the corresponding data outputs or to respective alternative data outputs, depending on a value on the control input, wherein each input and corresponding output of each stage are associated with a binary position identification value having a first number of bits; and wherein, in each stage, the said respective alternative data outputs have position identification values which differ from the position identification values of the said corresponding data outputs only in a single bit of the position identification values which corresponds to the respective stage.

According to another aspect of the present invention, there is provided a soft-decision Forward Error Correction decoder, comprising a switching circuit, the switching circuit comprising a plurality of stages, each stage having a plurality of data inputs, a plurality of data outputs corresponding to respective data inputs, and a control input, each stage comprising a switch for directing input signals on all of the data inputs either to the corresponding data outputs or to respective alternative data outputs, depending on a value on the control input, wherein each input and corresponding output of each stage are associated with a binary position identification value having a number of bits which corresponds to the number of stages; and wherein, in each stage, the said respective alternative data outputs have position identification values which differ from the position identification values of the said corresponding data outputs only in a single bit of the position identification values which corresponds to the respective stage.

BRIEF DESCRIPTION OF THE DRAWINGS

For a better understanding of the present invention, reference will now be made, by way of example, to the accompanying drawings.

DETAILED DESCRIPTION OF THE INVENTION

Figure 1:
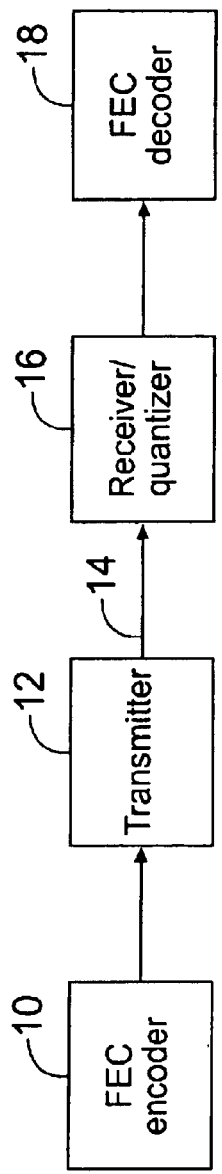
FIG. 1 is a block schematic diagram of a conventional Forward Error Correction coding system.
Figure 2:
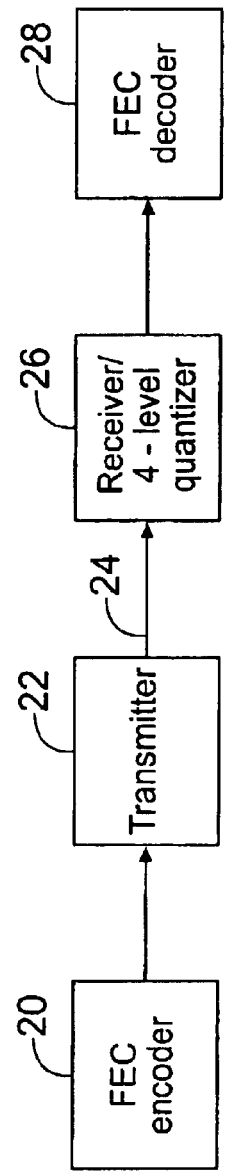
FIG. 2 is a block schematic diagram of a system in accordance with an aspect of the invention.

FIG. 2 shows a system in accordance with an aspect of the invention. Specifically, the source data is encoded in a forward error correction encoder 20, which computes parity bits as described above with reference to FIG. 1. Thus, as is conventional, the encoded data may for example be made up of a set of row codewords and an intersecting set of column codewords, forming a product code.

The source data and parity bits are transmitted by a transmitter 22 over a communications path 24. The present invention is particularly applicable to situations where the communications path 24 is an optical fibre, which transmits optical signals at high data rates. However, the invention is applicable to use with any form of communications path.

The transmitted signal, with any distortions and attenuation caused by the communications path, and with the addition of noise, is received in a receiver 26, which includes a 4-level quantizer. That is, for each received bit, the receiver outputs a polarity bit "1" or "0", depending on whether the receiver determines that the transmitted bit is more likely to have been a "1" or a "0", plus a confidence bit, the value of which indicates a degree of confidence in the detected polarity.

It should be noted that the present invention is also applicable to use with a receiver which includes a quantizer with more quantization levels.

The receiver output is supplied to a FEC decoder 28, which performs Forward Error Correction decoding. As is conventional, this process may be summarised in general terms as i) identifying whether a received binary sequence is a codeword; and ii) for cases where the received binary sequence is not a codeword, because of one or more errors in the received binary sequence as compared with the transmitted codeword, finding the codeword which is most likely to have been transmitted.

In the illustrated embodiment of the invention, the FEC decoder 28 is an Extended Hamming Code decoder.

During soft-decision Extended Hamming Code decoding, as described in UK Patent Application No. 0208011.7 and U.S. patent application Ser. No. 10/132,953, when the occurrence of an even (and non-zero) number of errors is detected, the decoder is required to establish whether there exists a unique pair of received bits having "low confidence" and whose position-ids SUM to the syndrome.

Figure 3:
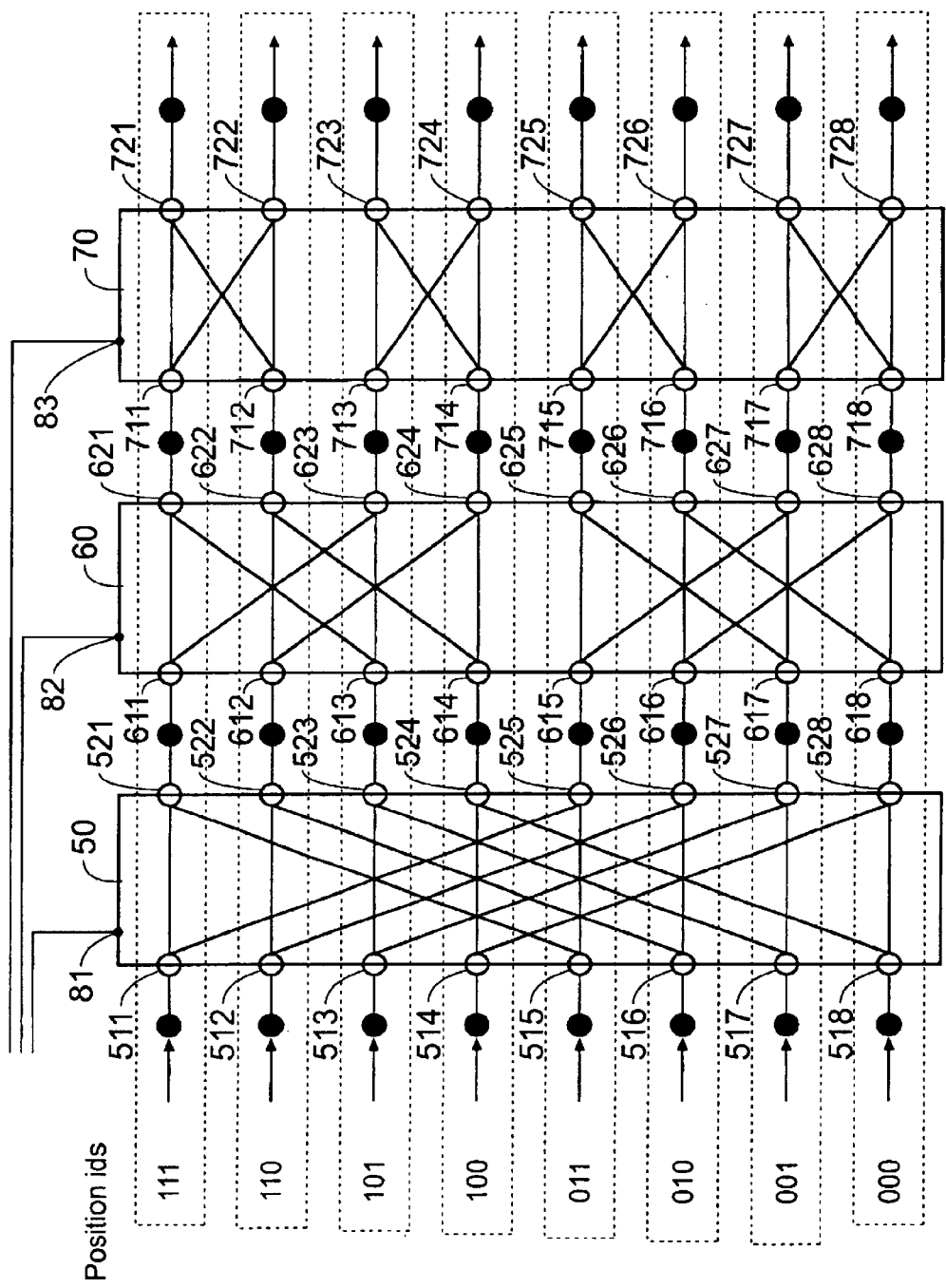
FIG. 3 is a schematic representation of a switching circuit in accordance with another aspect of the invention.

FIG. 3 shows an example of a switching circuit according to the present invention, which allows this to be established quickly. In general, for an Extended Hamming code with $2^n-n-1$ data bits (for some integer n) together with an n-bit parity code and one parity check bit, the switching circuit has n stages and $2^n$ inputs. Additional stages could be provided in some circumstances. In practice, n may for example be 7, 8 or 9, but FIG. 3 shows a small scale circuit for ease of illustration and understanding, although the operation is basically the same. Specifically, FIG. 3 shows a three-stage path switching circuit. The circuit has three position swapping stages 50, 60, 70. The first position swapping stage 50 has eight inputs 511–518 and eight outputs 521–528, the second position swapping stage 60 has eight inputs 611–618 and eight outputs 621–628, and the third position swapping stage 70 has eight inputs 711–718 and eight outputs 721–728.

Each of the inputs 511–518 to the first stage 50 defines a "position" in the circuit, which has a corresponding output 721–728 from the third stage 70, and FIG. 3 also shows an associated "position-id", namely a three bit number. Similarly, between each output from the first and second stages and the input of the respective subsequent stage, there is a connection point between switching stages.

Each position swapping stage 50, 60, 70 is controlled by a single-bit input signal on a respective control input 81, 82, 83. Based on the input control signal, the position swapping stage will either pass the signals received on each of its inputs to the outputs corresponding to the same position-ids, or will perform position swapping and pass the signals received on each of its inputs to other outputs, as illustrated in FIG. 3.

The switching circuit can be formed from conventional electronic switches of any suitable type, depending on the data which is to be switched. For example, when the signals supplied to the inputs are single-bit binary signals, then simple binary switches are suitable. When the signals supplied to the inputs are multiple-bit binary signals, or analog signals, then suitable switches must be used.

In the illustrated embodiment, the first position swapping stage 50 performs position swapping between inputs whose position-ids differ in their most significant bit. The second stage 60 performs position swapping between inputs whose position-ids differ in their next most significant bit, and the third stage 70 performs position swapping between inputs whose position-ids differ in their least significant bit. However, in general, the position swapping stages can be connected in any sequence.

The single bit control signals on the inputs 81, 82, 83 can be regarded as the constituent bits of a control code.

For a switching circuit with inputs having n-bit position-ids, and with n position swapping stages controlled by the constituent bits of an n-bit code C (with each bit of C controlling the stage associated with the corresponding bit of the position-ids), and where, for each stage, a control bit with value "logic 0" causes the stage to route its inputs straight through to the outputs in the same positions, and "logic 1" causes position swapping, the input on the position with position-id Pi is routed through to the output on the position with position-id Pj=Pi+C, simultaneously for all possible values of position-id Pi.

For example, with control code input C, the input at position C is routed through to the output for position-id 0 (because C+C=0, using the notation mentioned above, where + refers to a bitwise EXOR operation). Thus, by applying the control code C to the control inputs, the switching network selects the input at position C for output at the position with position-id 0.

Put another way, the switching circuit presents together, in each position, the data associated with the pairs of inputs whose position-ids SUM to the control code. Thus, as another example, if we apply S as a control code to the control inputs, the value observed at output position P1 will be the value applied at input position P2, where P2=P1+S, and the value observed at output position P2 will be the value applied at input position P1. Also, since P2=P1+S, it follows that P1+P2=S. In general, the pair of input and output values observed at each position correspond to a pair of inputs whose position-ids SUM to S, all such pairs appearing twice.

Returning to FIG. 2, during FEC decoding in the receiver, the parity check allows the FEC decoder to determine whether an odd or even number of errors has occurred, although it does not distinguish between an even number of errors and no errors.

By a process similar to that used in the encoder, a "syndrome" is computed by SUMMING the position-ids of all bit positions where a logic 1 is received. When no transmission errors occur the syndrome will be zero. However, a property of Extended Hamming codes is that, when transmission errors do occur, the SUM of the position-ids of the bits in error is equal to syndrome.

As mentioned above, in the soft-decision decoding process described in UK Patent Application No. 0208011.7, when the occurrence of an even (and non-zero) number of errors is detected, the decoder is required to establish whether there exists a unique pair of received bits both having "low confidence" and whose position-ids SUM to the syndrome.

In other words, for the calculated n-bit syndrome, S, we need to establish whether there exists a unique pair of received bits, both having low confidence, and whose position-ids, P1 and P2, SUM to S.

If such a pair of bits exists, it also follows (from the definition of the SUM operation) that P1+S=P2, and that P2+S=P1. As mentioned above, the switching circuit can present together the data associated with all of the pairs of received bits whose position-ids SUM to the syndrome. In particular, by using the confidence information associated with the $2^n$ bits of an Extended Hamming code as the data inputs, the switching circuit can identify whether there are any such pairs of bits, which SUM to the syndrome, and which both have low confidence.

For example, the receiver may have a four-level quantizer, providing a 1-bit "confidence" flag with each received bit, and where the flag has value "logic 1" for each bit where there is lower confidence in the recovered polarity.

For each code, the confidence flags associated with each received bit of the code, including the data bits, the parity code bits and the parity check bit, are applied to the inputs of the path switching circuit. At the same time, the calculated syndrome S is applied to the control inputs 81, 82, 83 of the switching circuit as a control code.

Then, as discussed above, if there exist any pairs of bits with low confidence, and whose position-ids SUM to the syndrome, logic 1's will appear at the inputs and outputs with those position-ids. Thus, these pairs of bits may be found by, for example, further circuitry (not shown) that includes a simple AND function of the input and output for each position. When both the input and the output, for a given position, have value "logic 1", then such a pair of received bits is identified.

In summary, to establish whether there exists a unique pair of inputs, with low confidence, and whose Hamming code position-ids SUM to Hamming syndrome S, we employ a switching circuit, as described above, as follows:

Apply the confidence flags to the switching circuit inputs;
Apply the syndrome, S, to the control inputs of the switching circuit;
Find all positions with low confidence value at both the input and output. Such positions occur in pairs, and the corresponding position-ids SUM to S;
If exactly one such pair of positions exist, then these correspond to the unique pair of inputs, with low confidence flags, whose position-ids sum to S;
Otherwise, there is no unique pair of such inputs.

With multi-bit confidence values, a switching circuit as shown in FIG. 3 may be similarly employed to route those multi-bit values, and further circuits may be used, for example, to identify the pair of bits, whose position-ids sum to S, and which have the lowest combined confidence values. With analog confidence information, suitable analog circuitry can be used to identify pairs of bits with the desired lowest confidence.

There is therefore described a switching circuit which allows identification of input signals with desired properties.

What is claimed is:

1. A switching circuit, comprising a plurality of stages, each stage having a plurality of data inputs, a plurality of data outputs corresponding to respective data inputs, and a control input, each stage comprising a switch for directing input signals on all of the data inputs either to the corresponding data outputs or to respective alternative data outputs, depending on a value on the control input, wherein each input and corresponding output of each stage are associated with a binary position identification value having a first number of bits; and wherein, in each stage, the said respective alternative data outputs have position identification values which differ from the position identification values of the said corresponding data outputs only in a single bit of the position identification values which corresponds to the respective stage.

2. A switching circuit as claimed in claim 1, having n stages, wherein the control inputs of each stage are connected such that the bit values of an n-bit control code are supplied to respective control inputs.

3. A switching circuit as claimed in claim 2, wherein input signals on all of the data inputs are passed to the corresponding data outputs if the value on the control input is 0 or to the respective alternative data outputs if the value on the control input is 1, such that, for a control code C, input signals at data inputs with position identification values Pi are routed to data outputs with position identification values Pj, where Pi+Pj=C, where "+" means a bitwise XOR operation, simultaneously for all possible values of position identification value Pi.

4. A soft-decision Forward Error Correction decoder, comprising a switching circuit, the switching circuit comprising a plurality of stages, each stage having a plurality of data inputs, a plurality of data outputs corresponding to respective data inputs, and a control input, each stage comprising a switch for directing input signals on all of the data inputs either to the corresponding data outputs or to respective alternative data outputs, depending on a value on the control input, wherein each input and corresponding output of each stage are associated with a binary position identification value having a number of bits which corresponds to the number of stages; and wherein, in each stage, the said respective alternative data outputs have position identification values which differ from the position identification values of the said corresponding data outputs only in a single bit of the position identification values which corresponds to the respective stage.

5. A soft-decision Forward Error Correction decoder as claimed in claim 4, having n stages, wherein the control inputs of each stage are connected such that the bit values of an n-bit control code are supplied to respective control inputs.

6. A soft-decision Forward Error Correction decoder as claimed in claim 5, wherein input signals on all of the data inputs are passed to the corresponding data outputs if the value on the control input is 0 or to the respective alternative data outputs if the value on the control input is 1, such that, for a control code C, input signals at data inputs with position identification values Pi are routed to data outputs with position identification values Pj, where Pi+Pj=C, where "+" means a bitwise XOR operation, simultaneously for all position identification values Pi.

7. A soft-decision Forward Error Correction decoder as claimed in claim 5, comprising means for computing a syndrome code of a received code signal, and applying the bit values of the syndrome code as the control code to the respective control inputs of the stages of the switching circuit.

8. A soft-decision Forward Error Correction decoder as claimed in claim 4, comprising means for detecting confidence values associated with bit values of a received code signal, and applying the confidence values to respective data inputs of a first stage of the switching circuit.

9. A soft-decision Forward Error Correction decoder as claimed in claim 8, further comprising circuitry for identifying a pair of bit values of the received code signal which have the lowest combined confidence.

10. A soft-decision Forward Error Correction decoder as claimed in claim 9, wherein the decoder operates on a working assumption that the identified pair of bit values of the received code signal, having the lowest combined confidence, are both in error.

11. A soft-decision Forward Error Correction decoder as claimed in claim 9, wherein the means for detecting confidence values comprises means for associating a one-bit confidence value with each data bit of the code signal.

12. A soft-decision Forward Error Correction decoder as claimed in claim 11, wherein said circuitry for identifying a pair of bit values of the received code signal which have the lowest combined confidence comprises means for identifying any pair of bits, each with low confidence, whose position identification values SUM to the calculated syndrome code.

13. A soft-decision Forward Error Correction decoder as claimed in claim 9, wherein the means for detecting confidence values comprises means for associating a multiple-bit confidence value with each data bit of the code signal.

14. A soft-decision Forward Error Correction decoder as claimed in claim 9, wherein the means for detecting confidence values comprises means for associating analog confidence information with each data bit of the code signal.

15. A soft-decision Forward Error Correction decoder, comprising:
- a switching circuit,
    - the switching circuit comprising a plurality of stages, each stage having a plurality of data inputs, a plurality of data outputs corresponding to respective data inputs, and a control input, each stage comprising a switch for directing an input on any one of the data inputs either to the corresponding data output or to a respective alternative data output, depending on a value on the control input,
    - wherein each input and corresponding output of each stage are associated with a binary position identification value having a number of bits which corresponds to the number of stages; and
    - wherein, in each stage, the said respective alternative data outputs have position identification values which differ from the position identification values of the said corresponding data outputs only in a single bit of the position identification values which corresponds to the respective stage;
- means for computing a syndrome code of a received code signal, and applying the bit values of the syndrome code as a control code to the respective control inputs of the stages of the switching circuit; and
- means for detecting confidence values associated with bit values of the received code signal, and applying the confidence values to respective data inputs of a first stage of the switching circuit.

\* \* \* \* \*